(12) United States Patent
McKiernan et al.

(10) Patent No.: US 8,916,675 B2
(45) Date of Patent: Dec. 23, 2014

(54) POLYMER AND POLYMERIZATION METHOD

(75) Inventors: Mary McKiernan, Cottenham (GB); Thomas Pounds, Cambridge (GB)

(73) Assignees: Cambridge Display Technology Limited, Cambridgeshire (GB); Sumitomo Chemical Company Limited, Tokyo (JP)

( * ) Notice: Subject to any disclaimer, the term of this patent is extended or adjusted under 35 U.S.C. 154(b) by 105 days.

(21) Appl. No.: 13/264,143

(22) PCT Filed: Apr. 15, 2010

(86) PCT No.: PCT/GB2010/000812
§ 371 (c)(1),
(2), (4) Date: Oct. 31, 2011

(87) PCT Pub. No.: WO2010/119277
PCT Pub. Date: Oct. 21, 2010

(65) Prior Publication Data
US 2012/0046440 A1    Feb. 23, 2012

(30) Foreign Application Priority Data
Apr. 16, 2009 (GB) .................................. 0906545.9

(51) Int. Cl.
C08G 67/02 (2006.01)
C08G 61/12 (2006.01)
H01L 51/00 (2006.01)
H01L 51/50 (2006.01)

(52) U.S. Cl.
CPC ............ C08G 61/12 (2013.01); H01L 51/0035 (2013.01); C08G 2261/164 (2013.01); C08G 2261/3142 (2013.01); C08G 2261/3162 (2013.01); C08G 2261/411 (2013.01); C08G 2261/5222 (2013.01); H01L 51/5012 (2013.01); Y02E 10/549 (2013.01)
USPC ........... 528/392; 428/544; 428/620; 428/624; 428/655; 428/539.5; 368/241

(58) Field of Classification Search
USPC ........ 428/544, 620, 624, 655, 539.5; 368/241
See application file for complete search history.

(56) References Cited

U.S. PATENT DOCUMENTS 5,150,006 A    9/1992  Van Slyke et al.
5,321,131 A    6/1994  Agrawal et al.
(Continued)

FOREIGN PATENT DOCUMENTS

EP    0 707 020 A2    4/1996
EP    0 842 208 A1    5/1998
(Continued)

OTHER PUBLICATIONS

Bernius et al., "Progress with Light-Emitting Polymers," Adv. Mat., 12(23):1737-1750 (2000).
(Continued)

*Primary Examiner* — Shane Fang
(74) *Attorney, Agent, or Firm* — Marshall, Gerstein & Borun LLP

(57) ABSTRACT

A method for forming a polymer comprising the polymerization of a plurality of monomers, wherein at least one of the plurality of monomers is one or both of: a charge transporting unit and a hydrocarbon monomer in which at least one carbon atom has been substituted by an atom or group with a greater quantity of unshared valence electrons than the carbon atom it has been substituted for, and wherein at least one of the plurality of monomers comprises an end-capping compound at one end of said monomer, the end-capping compound preventing polymerization at the end, wherein the end-capping compound is not charge transporting and comprises at least two rings. The end capping compound preferably consists of or includes a structural unit having the formula: $(Ar)_n$—X, wherein Ar in each occurrence independently represents an aryl or heteroaryl group; X represents a leaving group comprising a boron derivative group or halogen; and n is 2 or more.

7 Claims, 3 Drawing Sheets

(56) References Cited

U.S. PATENT DOCUMENTS

| | | | |
|---|---|---|---|
| 5,432,014 A | 7/1995 | Sano et al. | |
| 5,723,873 A | 3/1998 | Yang | |
| 5,777,070 A | 7/1998 | Inbasekaran et al. | |
| 5,798,170 A | 8/1998 | Zhang et al. | |
| 5,817,738 A | 10/1998 | Lubowitz et al. | |
| 6,083,634 A | 7/2000 | Shi | |
| 6,268,695 B1 | 7/2001 | Affinito | |
| 6,353,083 B1 | 3/2002 | Inbasekaran et al. | |
| 6,700,322 B1 | 3/2004 | Duggal et al. | |
| 6,847,162 B2 | 1/2005 | Duggal et al. | |
| 7,030,138 B2 | 4/2006 | Fujimoto et al. | |
| 7,094,477 B2 | 8/2006 | Kamatani et al. | |
| 7,125,998 B2 | 10/2006 | Stossel et al. | |
| 7,147,935 B2 | 12/2006 | Kamatani et al. | |
| 7,238,435 B2 | 7/2007 | Kamatani et al. | |
| 2002/0117662 A1 | 8/2002 | Nii | |
| 2002/0182441 A1 | 12/2002 | Lamansky et al. | |
| 2004/0062930 A1 | 4/2004 | Roberts et al. | |
| 2005/0164034 A1* | 7/2005 | Park et al. | 428/690 |
| 2007/0032632 A1 | 2/2007 | Tsukioka et al. | |
| 2007/0237983 A1 | 10/2007 | Li et al. | |
| 2008/0145571 A1 | 6/2008 | Kobayashi et al. | |
| 2008/0309229 A1* | 12/2008 | Steudel et al. | 313/504 |

FOREIGN PATENT DOCUMENTS

| | | |
|---|---|---|
| EP | 0 880 303 A1 | 11/1998 |
| EP | 0 901 176 A2 | 3/1999 |
| EP | 0 947 123 A1 | 10/1999 |
| EP | 0 949 850 A1 | 10/1999 |
| EP | 1 245 659 A1 | 10/2002 |
| EP | 1 754 736 A1 | 2/2007 |
| GB | 2 348 316 A | 9/2000 |
| GB | 2 446 320 A | 8/2008 |
| JP | 2001-223078 A | 8/2001 |
| JP | 2002-324679 A | 11/2002 |
| JP | 2004-327443 A | 11/2004 |
| JP | 2005-060571 A | 3/2005 |
| JP | 2005-523369 A | 8/2005 |
| JP | 2006-169265 A | 6/2006 |
| JP | 2006-182920 A | 7/2006 |
| WO | WO-98/10621 A1 | 3/1998 |
| WO | WO-98/57381 A1 | 12/1998 |
| WO | WO-99/48160 A1 | 9/1999 |
| WO | WO-00/48258 A1 | 8/2000 |
| WO | WO-00/53656 A1 | 9/2000 |
| WO | WO-00/55927 A1 | 9/2000 |
| WO | WO-01/19142 A1 | 3/2001 |
| WO | WO-01/62869 A1 | 8/2001 |
| WO | WO-01/81649 A1 | 11/2001 |
| WO | WO-02/31896 A2 | 4/2002 |
| WO | WO-02/44189 A1 | 6/2002 |
| WO | WO-02/45466 A1 | 6/2002 |
| WO | WO-02/066552 A1 | 8/2002 |
| WO | WO-02/068435 A1 | 9/2002 |
| WO | WO-02/081448 A1 | 10/2002 |
| WO | WO-02/084759 A1 | 10/2002 |
| WO | WO-03/018653 A1 | 3/2003 |
| WO | WO-03/022908 A1 | 3/2003 |
| WO | WO-03/089542 A1 | 10/2003 |
| WO | WO-2005/014691 A2 | 2/2005 |
| WO | WO-2006/094101 A1 | 9/2006 |

OTHER PUBLICATIONS

Chen et al., "Recent Developments in Molecular Organic Electroluminescent Materials," Macromol. Sym., 125:1-48 (1997).

Grell et al., "Blue Polarized Electroluminescence from a Liquid-Crystal Polymer Device," Adv. Mater., 11(8):671-675 (1999).

Lee et al., "Efficient White Polymer-Light-Emitting-Diodes Based on Polyfluorene End-Capped with Yellowish-Green Fluorescent Dye and Blended with a Red Phosphorescent Iridium Complex," Polymer, 50(12):2558-2564 (2009).

Michaelson, "The work function of the elements and its periodicity", J. Applied Physics, 48(11):4729-4733 (1977).

Miteva et al., "Improving the Performance of Polyfluorene-Based Organic Light-Emitting Diodes via End-Capping," Adv. Mater., 13(8):565-570 (2001).

Niu et al., "Thermal Annealing Below the Glass Transition Temperature: A General Way to Increase Performance of Light-Emitting Diodes Based on Copolyfluorenes," Appl. Phys. Lett., 81(4):634-636 (2002).

Setayesh et al., "Bridging the Gap Between Polyfluorene and Ladder-Poly-p-phenylene: Synthesis and Characterization of Poly-2,8-indenofluorene," Macromolecules, 33(6):2016-2020 (2000).

Sun et al., "Star Polyfluorenes with a Triphenylamine-Based Core," Macro. Rapid Comm., 26(13):1064-1069 (2005).

Tokito et al., "Metal oxides as a hole-injecting layer for an organic electroluminescent device", J. Phys. D: Appl. Phys., 29:2750-2753 (1996).

Yamaguchi et al., "Effects of B and C on the Ordering of L10-CoPt Thin Films," Appl. Phys. Lett., 79(5):2001-2003 (2001).

Yamamoto, "Electrically Conducting and Thermally Stable p-Conjugated Poly(Arylenes)s Prepared by Organometallic Processes," Prog. Polym. Sci., 17:1153-1205 (1993).

Yang et al., "Efficient blue polymer light-emitting diodes from a series of soluble poly(paraphenylene)s", J. Appl. Phys., 79(2):934-939 (1996).

Yang et al., "Influences of End-Groups and Thermal Effect on the Red-Shifted Emission in the Poly (9, 9-dioctyfluorene) Light Emitting Diodes," Synth. Met., 135-135:189-190 (2003).

Combined Search and Examination Report for Application No. GB0906545.9, dated Feb. 1, 2010.

International Preliminary Report on Patentability for Application No. PCT/GB2010/000812, dated Oct. 18, 2011.

International Search Report and Written Opinion for Application No. PCT/GB2010/000812, dated Jul. 22, 2010.

Partial English translation of Office Action for corresponding Japanese Patent Application No. 2012-505236, dated Oct. 1, 2013.

\* cited by examiner

POLYMER AND POLYMERIZATION METHOD

BACKGROUND OF THE INVENTION

Semi-conducting polymers are well-known, and have a range of uses in a number of electronic devices, including as charge transporting or electroluminescent materials in light emitting diodes, field effect transistors and photo-voltaic devices.

Semi-conducting polymers are conjugated polymers which comprise delocalized pi-electrons along the backbone of the polymer. This delocalized pi-electron system confers semi-conducting properties on the polymer, but unlike conventional semi-conductors, the amorphous chain morphology of semi-conducting polymers provides an inhomogenous broadening of the energies of the chain segments and leads to hopping type transport. Semi-conducting polymers can be used as electroluminescent polymers. When injected with holes and electrons, this transporting characteristic enables charge combination to occur in the polymer. This in turn gives rise to singlet excitons, the decay of which causes the emission of light.

There are various known ways of producing semi-conducting polymers, examples of which include Suzuki polymerization as described in, for example, WO 00/53656 and Yamamoto polymerization as described in, for example, T. Yamamoto, "Electrically Conducting And Thermally Stable π-Conjugated Poly(arylene)s Prepared by Organometallic Processes", Progress in Polymer Science 1993, 17, 1153-1205. These polymerization techniques both operate via a "metal insertion" wherein the metal atom of a metal complex catalyst is inserted between an aryl group and a leaving group of a monomer. In the case of Yamamoto polymerization, a nickel complex catalyst is used; in the case of Suzuki polymerization, a palladium complex catalyst is used.

For example, in the synthesis of a linear polymer by Yamamoto polymerization, a monomer having two reactive halogen groups is used. Similarly, according to the method of Suzuki polymerization, at least one reactive group is a boron derivative group such as a boronic acid or boronic ester and the other reactive group is a halogen. Preferred halogens are chlorine, bromine and iodine, most preferably bromine. As alternatives to halides, other leaving groups capable of participating in metal insertion include groups include tosylate, mesylate and triflate.

Consequently, at each terminus of the polymer, as well as at the terminus of any side-chain of the polymer, there will be a monomer unit which has only been polymerized at one end. The opposing end of this monomer, which is by definition either a terminus of the polymer or a terminus of a side chain of the polymer, will comprise a leaving group. These reactive leaving groups may be detrimental to device performance and so it is desirable to replace them using a process known as end-capping, in which the leaving group at the terminus of the polymer or the side chain is replaced with phenyl, as described in U.S. Pat. No. 5,777,070. In particular, by replacing the leaving group with a charge-transporting moiety, as described, for example, in Adv. Mater. 1999, 11(8), 671-675, the efficiency of the semi-conducting polymer may be increased, without affecting the electronic properties of the polymer chain.

SUMMARY OF THE INVENTION

In a first aspect, the invention provides a process for end-capping a semi-conducting polymer, wherein:
said process comprises replacing the end group of at least one terminus of said polymer with an end-capping compound; and
said end-capping compound is not charge transporting and comprises at least two rings.

Optionally, said polymer comprises a charge transporting repeat unit.

Optionally, said polymer comprises a plurality of monomers wherein at least one monomer is a hydro-carbon monomer in which at least one carbon atom has been substituted by an atom or group with a greater quantity of unshared valence electrons than the carbon atom it has been substituted for.

Optionally, said process further comprising the polymerization of said plurality of monomers to form said polymer, wherein said polymer is formed in the presence of a metal catalyst.

Optionally, said metal catalyst is a palladium catalyst.

Optionally, the molecular weight of the polymer is at least partially controlled by using an excess of brominated monomer.

Optionally, said plurality of monomers comprises at least two distinct sets of monomers,
wherein said first set of monomers comprises one or more hydro-carbon monomers in which at least one carbon atom has been substituted by an atom or group with a greater quantity of unshared valence electrons than the carbon atom it has been substituted for,
and wherein said second set of monomers comprises one or more monomers which comprise a lesser quantity of unshared valence electrons relative to said first set of monomers.

Optionally, said first set of monomers polymerizes more slowly than said second set of monomers.

Optionally, said atom or group with a greater quantity of unshared valence electrons than the carbon atom it has been substituted for comprises at least one amine group.

Optionally, said end-capping compound does not comprise a nitrogen atom.

Optionally, said end-capping group is a hydrocarbon.

Optionally, said end-capping group is an unsaturated hydrocarbon.

Optionally, the end-capping group comprises at least 3 rings.

Optionally, the end-capping group comprises one or more fluorene groups, and optionally comprises a plurality of fluorene groups.

In a second aspect, the invention provides a process for forming a polymer comprising the polymerization of a plurality of monomers,
wherein at least one of said plurality of monomers is one or both of: a charge transporting unit; and a hydro-carbon monomer in which at least one carbon atom has been substituted by an atom or group with a greater quantity of unshared valence electrons than the carbon atom it has been substituted for,
and wherein at least one of said plurality of monomers comprises an end-capping compound at one end of said monomer, said end-capping compound preventing polymerization at said end, wherein said end-capping compound is not charge transporting and comprises at least two rings.

Optionally, at least one of said hydro-carbon monomers in which at least one carbon atom has been substituted by an atom or group with a greater quantity of unshared valence electrons than the carbon atom it has been substituted for, comprises an end-capping compound at one end of said monomer, said end-capping compound preventing polymerization at said end, wherein said end-capping compound is not charge transporting and comprises at least two rings.

Optionally, said polymerization occurs in the presence of a metal catalyst.

Optionally, said metal catalyst is a palladium catalyst.

Optionally, the molecular weight of the polymer is at least partially controlled by using an excess of brominated monomer.

Optionally, said plurality of monomers comprises at least two distinct sets of monomers, wherein:
  said first set of monomers comprises said one or more hydro-carbon monomers in which at least one carbon atom has been substituted by an atom or group with a greater quantity of unshared valence electrons than the carbon atom it has been substituted for;
  said second set of monomers comprises one or more monomers which comprise a lesser quantity of unshared valence electrons relative to said first set of monomers; and
  at least one of said one or more hydro-carbon monomers in which at least one carbon atom has been substituted by an atom or group with a greater quantity of unshared valence electrons than the carbon atom it has been substituted for comprises an end-capping compound at one end of said monomer, said end-capping compound preventing polymerization at said end, wherein said end-capping compound is not charge transporting and comprises at least two rings Optionally, said first set of monomers polymerizes more slowly than said second set of monomers.

Optionally, said atom or group with a greater quantity of unshared valence electrons than the carbon atom it has been substituted for comprises at least one amine group.

Optionally, said end-capping compound does not comprise a nitrogen atom.

Optionally, said end-capping group is a hydrocarbon.

Optionally, said end-capping group is an unsaturated hydrocarbon.

In a third aspect, the invention provides a semi-conducting polymer wherein:
  said polymer comprises a plurality of polymerized monomers; wherein
  at least one of said plurality of polymerized monomers is one or both of: a charge transporting unit; and a hydrocarbon monomer in which at least one carbon atom has been substituted by an atom or group with a greater quantity of unshared valence electrons than the carbon atom it has been substituted for;
  the end group of at least one terminus of said polymer is an end-capping compound, and
  and said end-capping compound is not charge transporting and comprises at least two rings.

Optionally, said plurality of monomers comprises at least two distinct sets of monomers,
  wherein said first set of monomers are one or more hydro-carbon monomers in which at least one carbon atom has been substituted by an atom or group with a greater quantity of unshared valence electrons than the carbon atom it has been substituted for,
  and wherein said second set of monomers are one or more monomers which comprise a lesser quantity of unshared valence electrons, relative to said first set of monomers.

Optionally, said atom or group with a greater quantity of unshared valence electrons than the carbon atom it has been substituted for comprises at least one amine group.

In a fourth aspect, the invention provides a film comprising the polymer according to the third aspect of the invention.

In a fifth aspect, the invention provides an electronic device comprising the polymer according to the fourth aspect of the invention.

Optionally, said device is a light emitting diode, a field effect transistors or a photo-voltaic device.

Optionally, said device is a light emitting diode.

DETAILED DESCRIPTION

It has been surprisingly discovered that the use of an end-capping compound comprising at least two rings and which is not charge transporting produces a more consistent charge balance in a semi-conducting polymer and provides an increase in both the efficiency and the lifetime of the polymer. Without wishing to be bound by any particular mechanism, it is believed that these benefits are achieved because the at least two rings of the end-capping moiety ensure that electron-rich monomers are spaced further away from the termini of the polymers and/or the termini of the side-chains of the polymer, and because the end-capping moiety is not charge transporting, a more favorable delocalization of the electrons of the electron-rich groups is achieved.

As used herein, the term "not charge transporting" means not increasing the mobility of electrons, holes (i.e. charge-deficiencies such as electron deficiencies) and ions of the polymer as compared to the same polymer endcapped with phenyl. This excludes end-capping groups which are charge transporting, as well as end-capping groups capable of being transformed into charge transporting groups, whether by protonation, cleavage, proteolysis, photolysis or otherwise. By way of example, an end-capping group which is not charge transporting would not comprise an amine group.

Electron-rich monomers, for example monomers comprising at least one amine group, may beneficially be used to provide hole transport in a polymer. The repeat units derived from these monomers may also be used to provide emission. However, these monomers react more slowly in the polymerization reactions used to form semi-conducting polymers than electron-poor monomers. As used herein, an electron-rich monomer is a hydro-carbon monomer in which at least one carbon atom has been substituted by an atom or group with a greater quantity of unshared valence electrons than the carbon atom it has been substituted for. This results in different monomers being incorporated at different rates into the polymer, with electron-rich monomers being incorporated more slowly than electron-poor monomers. There is therefore a greater concentration of electron rich polymers towards the termini of the polymer.

Figure 1:
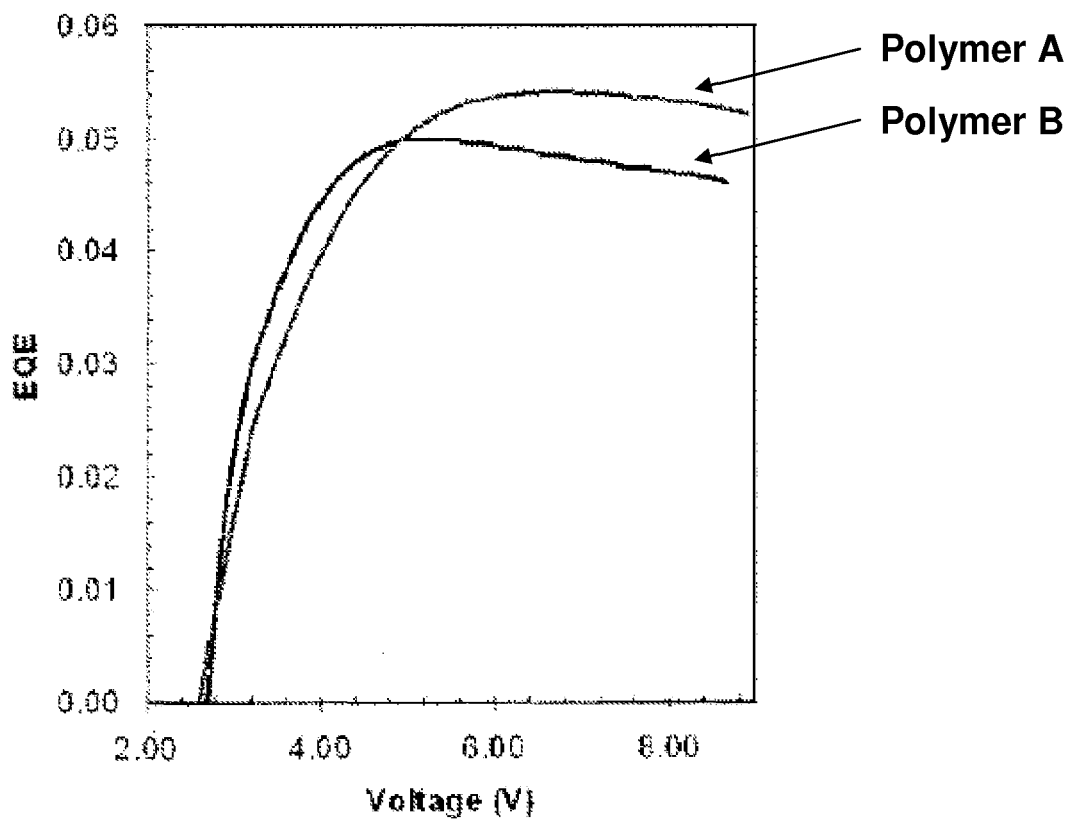
FIG. 1 shows the reduced efficiency of a low molecular weight polymer produced by using an excess of brominated monomer in a Suzuki polymerization.
Figure 2:
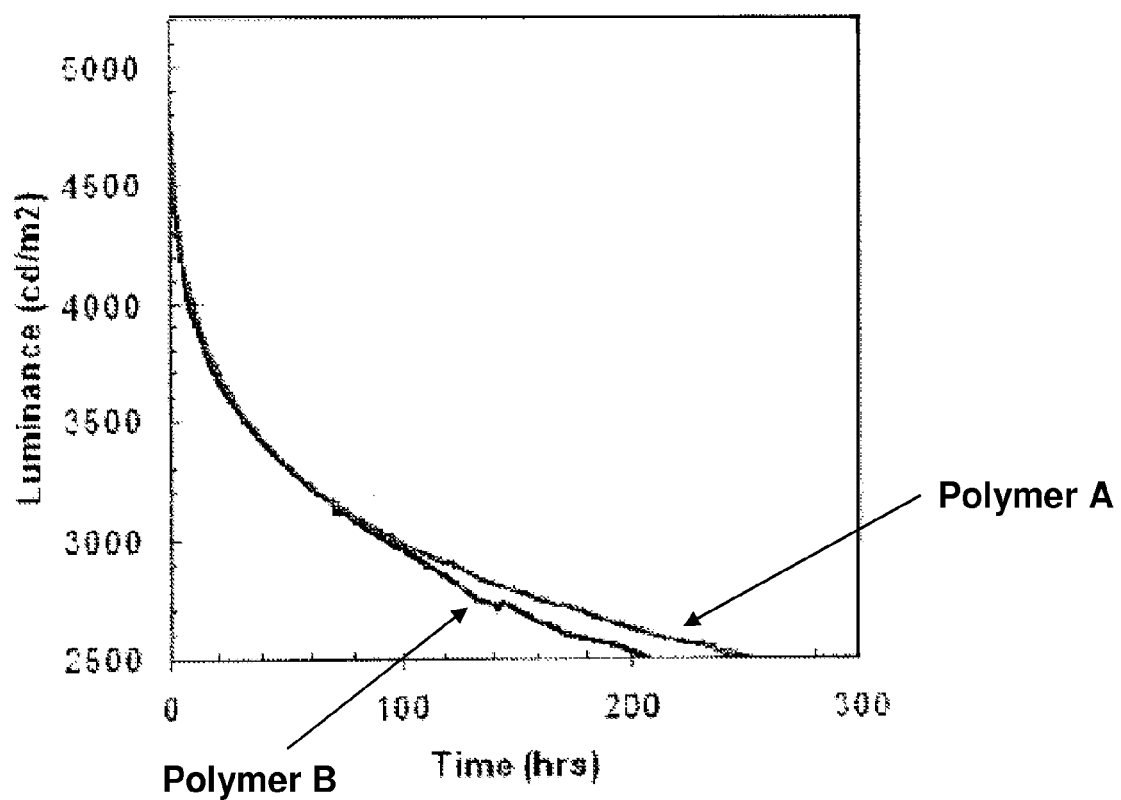
FIG. 2 shows the reduced lifetime of a low molecular weight polymer produced by using an excess of brominated monomer in a Suzuki polymerization.

This effect is apparent if the molecular weight of the polymer is controlled (or at least partially controlled) by using an excess of brominated monomer in a Suzuki polymerization, as the increased number of termini in a low molecular weight polymer (i.e. having Mw of 250,000 or less) leads to a greater proportion of electron-rich monomers being located towards the termini of the polymer. The resultant loss of efficiency and lifetime of the polymer is shown in FIGS. 1 and 2 respectively, in which A is a control polymer produced with a diester:dibromide ratio of 1:1, and B is a low molecular weight polymer produced with a diester:dibromide ratio of 0.98:1.

Without wishing to be bound by any theory, it is believed that this distribution of electron-rich groups is detrimental to both lifetime and efficiency of the material. It is believed that by providing end-capping groups as described above, stability of the polymer is increased because the long end-capping groups space the electron rich groups further from the polymer termini than a conventional, phenyl end-capping group.

The benefits provided by the present invention should also be obtained where electron-rich monomers will be incorporated towards the termini of the main chain or branches of the polymer for reasons other than rate of polymerization, for example where a greater percentage of electron rich monomers to electron poor monomers are used, or simply because of the chance involved in the polymerization reaction.

Conjugated Polymers (Fluorescent and/or Charge Transporting)

Suitable electroluminescent polymers for use in the present invention include polyarylenes formed by metal insertion polymerization.

Polymers are formed from the polymerization of a plurality of monomers. Monomers are chemically joined to other monomers forming a chain. As such, each monomer can be considered as having at least two "ends", i.e. locations at which the monomer can be chemically joined to another monomer. By chemically joining each end of a monomer to other monomers, a chain of monomers is formed, creating the polymer. A monomer may have more than two such locations, and if so, this can give rise to a polymer with branches.

A polymer created in this way will at each end of the polymer chain have a monomer which has only been polymerised polymerized at one end. The other, unpolymerized end of the polymer is the terminus of the polymer, with the group present at the unpolymerized end of the monomer, i.e. at the terminus of the polymer, being an end-group. Likewise, where branches are present, each branch will comprise at the end of the chain a a monomer which has only been polymerized at one end with the group present at the unpolymerized end being an end-group. Depending upon the polymerization method used, such end-groups can comprise leaving groups.

When monomers of the same type are polymerized (whether with other types of monomer or not), polymers comprising repeat units are formed. Polymers preferably comprise a repeat unit selected from arylene repeat units as disclosed in, for example, Adv. Mater. 2000 12(23) 1737-1750 and references therein. Exemplary first repeat units include: 1,4-phenylene repeat units as disclosed in J. Appl. Phys. 1996, 79, 934; fluorene repeat units as disclosed in EP 0842208; indenofluorene repeat units as disclosed in, for example, Macromolecules 2000, 33(6), 2016-2020; and spirofluorene repeat units as disclosed in, for example EP 0707020. Each of these repeat units is optionally substituted. Examples of substituents include solubilising groups such as $C_{1-20}$ alkyl or alkoxy; electron withdrawing groups such as fluorine, nitro or cyano; and substituents for increasing glass transition temperature (Tg) of the polymer.

Particularly preferred polymers comprise optionally substituted, 2,7-linked fluorenes, most preferably repeat units of formula I:

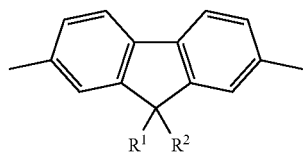

I wherein $R^1$ and $R^2$ are independently selected from hydrogen or optionally substituted alkyl wherein one or more non-adjacent C atoms may be replaced with O, S, N, C=O and —COO—, alkoxy, aryl, arylalkyl, heteroaryl and heteroarylalkyl. More preferably, at least one of $R^1$ and $R^2$ comprises an optionally substituted $C_4$-$C_{20}$ alkyl or aryl group.

In the case where R is aryl or heteroaryl, preferred optional substituents include alkyl groups wherein one or more non-adjacent C atoms may be replaced with O, S, N, C=O and —COO—.

Optional substituents for the fluorene unit, other than substituents $R^1$ and $R^2$, are preferably selected from the group consisting of alkyl wherein one or more non-adjacent C atoms may be replaced with O, S, N, C=O and —COO—, optionally substituted aryl, optionally substituted heteroaryl, alkoxy, alkylthio, fluorine, cyano and arylalkyl.

Polymers may provide one or more of the functions of hole transport, electron transport and emission depending on which layer of the device it is used in and the nature of co-repeat units.

Preferably, the polymer comprises an arylene repeat unit as described above and an arylamine repeat unit, in particular a repeat unit II:

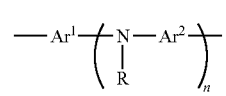

II wherein $Ar^1$ and $Ar^2$ are optionally substituted aryl or heteroaryl groups, n is greater than or equal to 1, preferably 1 or 2, and R is H or a substituent, preferably a substituent. R is preferably alkyl or aryl or heteroaryl, most preferably aryl or heteroaryl. Any of the aryl or heteroaryl groups in the unit of formula 1 may be substituted. Preferred substituents include alkyl and alkoxy groups. Any of the aryl or heteroaryl groups in the repeat unit of Formula I may be linked by a direct bond or a divalent linking atom or group. Preferred divalent linking atoms and groups include O, S; substituted N; and substituted C.

Particularly preferred units satisfying Formula II include units of Formulae 1-3:

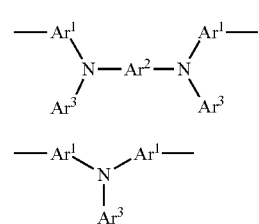

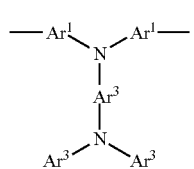

wherein $Ar^1$ and $Ar^2$ are as defined above; and $Ar^3$ is optionally substituted aryl or heteroaryl. Where present, preferred substituents for $Ar^3$ include alkyl and alkoxy groups.

Preferred concentration of the arylamine unit depends on the function of the polymer containing it. If the arylamine unit is present in a polymer for use in a hole transport layer it is preferably present in an amount up to 95 mol %, preferably up to 70 mol %. If the arylamine unit is present in a polymer for use in an emissive layer (as an emissive polymer or as the host for an emissive dopant) it is preferably present in an amount up to 30 mol %, preferably up to 20 mol %. These percentages apply to the total number of arylamine units present in the polymer in the case where more than one type of repeat unit of formula II is used.

The polymer may comprise heteroarylene repeat units for charge transport or emission. Preferred heteroarylene repeat units are selected from formulae 7-21:

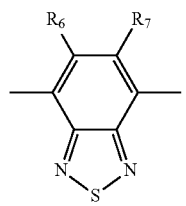

wherein $R_6$ and $R_7$ are the same or different and are each independently hydrogen or a substituent group, preferably alkyl, aryl, perfluoroalkyl, thioalkyl, cyano, alkoxy, heteroaryl, alkylaryl or arylalkyl. For ease of manufacture, $R_6$ and $R_7$ are preferably the same. More preferably, they are the same and are each a phenyl group.

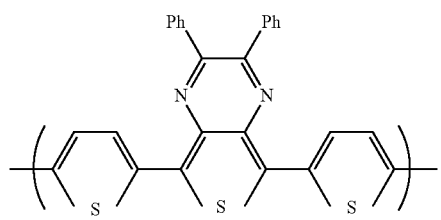

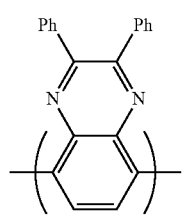

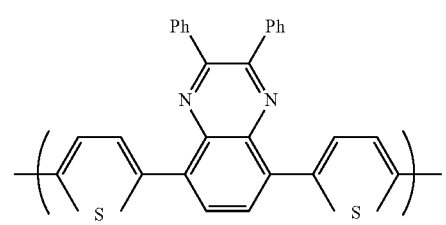

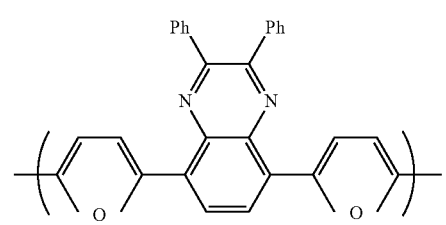

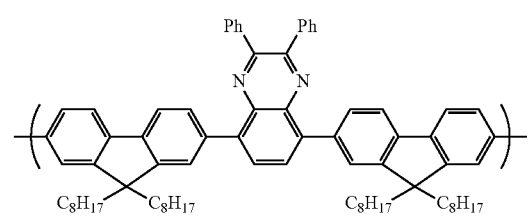

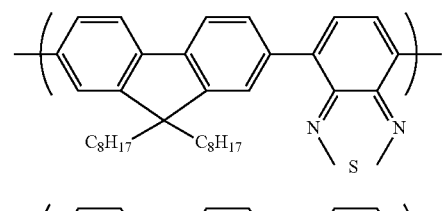

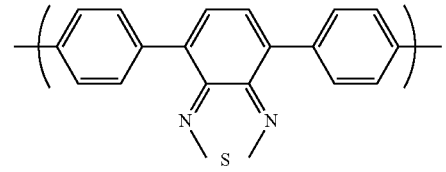

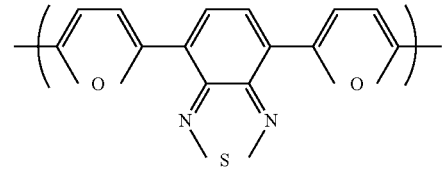

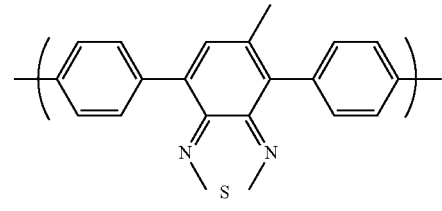

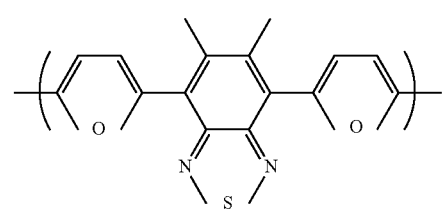

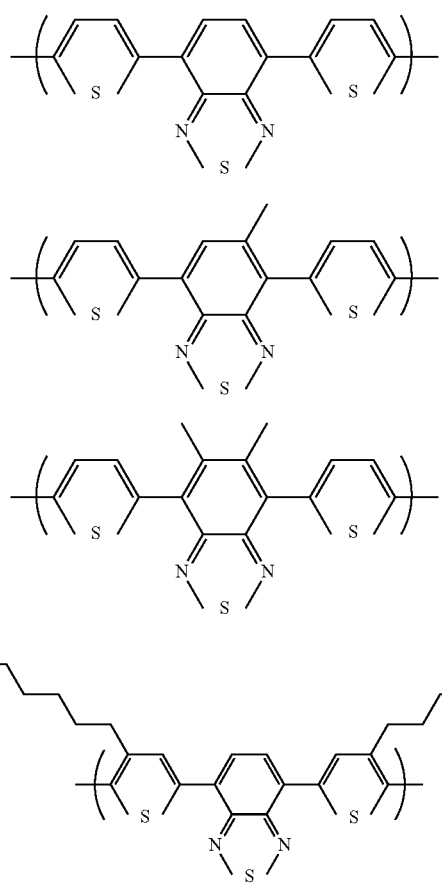

Electroluminescent copolymers may comprise an electroluminescent region and at least one of a hole transporting region and an electron transporting region as disclosed in, for example, WO 00/55927 and U.S. Pat. No. 6,353,083. If only one of a hole transporting region and electron transporting region is provided then the electroluminescent region may also provide the other of hole transport and electron transport functionality. Alternatively, an electroluminescent polymer may be blended with a hole transporting material and/or an electron transporting material. Polymers comprising one or more of a hole transporting repeat unit, electron transporting repeat unit and emissive repeat unit may provide said units in a polymer main-chain or polymer side-chain.

The different regions within such a polymer may be provided along the polymer backbone, as per U.S. Pat. No. 6,353,083, or as groups pendant from the polymer backbone as per WO 01/62869.

Polymerization Methods

Preferred methods for preparation of these polymers are Suzuki polymerization as described in, for example, WO 00/53656 and Yamamoto polymerization as described in, for example, T. Yamamoto, "Electrically Conducting And Thermally Stable π-Conjugated Poly(arylene)s Prepared by Organometallic Processes", Progress in Polymer Science 1993, 17, 1153-1205. These polymerization techniques both operate via a "metal insertion" wherein the metal atom of a metal complex catalyst is inserted between an aryl group and a leaving group of a monomer. In the case of Yamamoto polymerization, a nickel complex catalyst is used; in the case of Suzuki polymerization, a palladium complex catalyst is used.

For example, in the synthesis of a linear polymer by Yamamoto polymerization, a monomer having two reactive halogen groups is used. Similarly, according to the method of Suzuki polymerization, at least one reactive group is a boron derivative group such as a boronic acid or boronic ester and the other reactive group is a halogen. Preferred halogens are chlorine, bromine and iodine, most preferably bromine.

It will therefore be appreciated that repeat units and end groups comprising aryl groups as illustrated throughout this application may be derived from a monomer carrying a suitable leaving group.

Suzuki polymerization may be used to prepare regioregular, block and random copolymers. In particular, homopolymers or random copolymers may be prepared when one reactive group is a halogen and the other reactive group is a boron derivative group. Alternatively, block or regioregular, in particular AB, copolymers may be prepared when both reactive groups of a first monomer are boron and both reactive groups of a second monomer are halogen.

As alternatives to halides, other leaving groups capable of participating in metal insertion include groups include sulfonic acid esters such as tosylate, mesylate and triflate.

End-Capping

One general class of end-capping groups for use in the process of the invention comprises formula (V):

$(Ar)_n$—X  (V)

wherein Ar in each occurrence independently represents an aryl or heteroaryl group; X represents a leaving group as described above, e.g. a boron derivative group or halogen; and n is at least 2. The Ar groups may be substituted. Adjacent Ar groups may be linked by a divalent atom or group.

In one embodiment, the end-capping group comprises a chain of at least 2 phenyl rings.

In another embodiment, the end-capping group comprises at least one fluorene unit (i.e. two adjacent Ar groups are phenyl linked by a C atom). Preferably, the end-capping group comprises a plurality of fluorene units. Preferably, the end-capping group comprises a chain of up to 10 fluorene units.

As stated above, the end group does not increase the mobility of the polymer as compared to the same polymer end-capped with phenyl, and so the nature of the Ar group and substituents thereon, if any, must be selected accordingly. For example, Ar is preferably not oxadiazole and the substituents, if any, do not comprise nitrogen.

Alkyl substituents are preferred. In particular, where the end-capping group comprises fluorene, alkyl substituents on the C atom bridging the two phenyl groups of the fluorene group are preferred.

The end-capping group may be added at the start of, during, or at the end of polymerization.

General Device Architecture

Polymers of the present invention may be included in a range of different devices, including light emitting diodes, filed effect transistors and as photo-voltaic devices.

Figure 3:
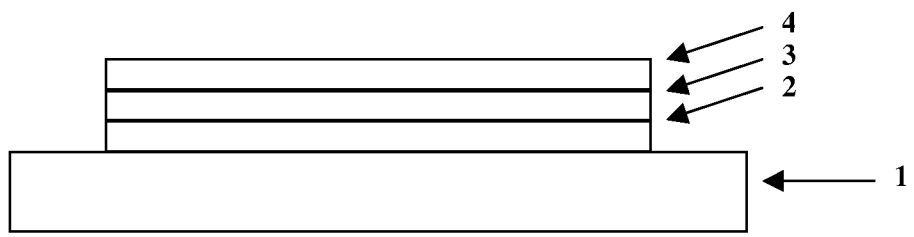
FIG. 3 provides an electroluminescent device according to the invention.

With reference to FIG. 3, the architecture of an electroluminescent device according to one aspect of the invention comprises a transparent glass or plastic substrate 1, an anode 2 and a cathode 4. An electroluminescent layer 3 is provided between anode 2 and cathode 4.

In a practical device, at least one of the electrodes is semi-transparent in order that light may be emitted. Where the anode is transparent, it typically comprises indium tin oxide.

Charge Transport Layers

Further layers may be located between anode 2 and cathode 3, such as charge transporting, charge injecting or charge blocking layers.

In particular, it is desirable to provide a conductive hole injection layer, which may be formed from a conductive organic or inorganic material provided between the anode 2 and the electroluminescent layer 3 to assist hole injection from the anode into the layer or layers of semi-conducting polymer. Examples of doped organic hole injection materials include doped poly(ethylene dioxythiophene) (PEDT), in particular PEDT doped with a charge-balancing polyacid such as polystyrene sulfonate (PSS) as disclosed in EP 0901176 and EP 0947123, polyacrylic acid or a fluorinated sulfonic acid, for example Nafion®; polyaniline as disclosed in U.S. Pat. No. 5,723,873 and U.S. Pat. No. 5,798,170; and poly(thienothiophene). Examples of conductive inorganic materials include transition metal oxides such as VOx MoOx and RuOx as disclosed in Journal of Physics D: Applied Physics (1996), 29(11), 2750-2753.

If present, a hole transporting layer located between anode 2 and electroluminescent layer 3 preferably has a HOMO level of less than or equal to 5.5 eV, more preferably around 4.8-5.5 eV. HOMO levels may be measured by cyclic voltammetry, for example.

If present, an electron transporting layer located between electroluminescent layer 3 and cathode 4 preferably has a LUMO level of around 3-3.5 eV.

Electroluminescent Layer

Electroluminescent layer 3 may consist of the end-capped electroluminescent polymer according to the present invention alone or may comprise the electroluminescent polymer in combination with one or more further materials. In particular, the electroluminescent polymer may be blended with hole and/or electron transporting materials as disclosed in, for example, WO 99/48160, or may comprise a luminescent dopant in a semi-conducting host matrix. Alternatively, the electroluminescent polymer may be covalently bound to a charge transporting material and/or host material.

Electroluminescent layer 3 may be patterned or unpatterned. A device comprising an unpatterned layer may be used an illumination source, for example. A white light emitting device is particularly suitable for this purpose. A device comprising a patterned layer may be, for example, an active matrix display or a passive matrix display. In the case of an active matrix display, a patterned electroluminescent layer is typically used in combination with a patterned anode layer and an unpatterned cathode. In the case of a passive matrix display, the anode layer is formed of parallel stripes of anode material, and parallel stripes of electroluminescent material and cathode material arranged perpendicular to the anode material wherein the stripes of electroluminescent material and cathode material are typically separated by stripes of insulating material ("cathode separators") formed by photolithography.

Cathode

Cathode 4 is selected from materials that have a workfunction allowing injection of electrons into the electroluminescent layer. Other factors influence the selection of the cathode such as the possibility of adverse interactions between the cathode and the electroluminescent polymer of the present invention. The cathode may consist of a single material such as a layer of aluminum. Alternatively, it may comprise a plurality of metals, for example a bilayer of a low workfunction material and a high workfunction material such as calcium and aluminum as disclosed in WO 98/10621; elemental barium as disclosed in WO 98/57381, Appl. Phys. Lett. 2002, 81(4), 634 and WO 02/84759; or a thin layer of metal compound, in particular an oxide or fluoride of an alkali or alkali earth metal, to assist electron injection, for example potassium fluoride, sodium fluoride, lithium fluoride as disclosed in WO 00/48258; barium fluoride as disclosed in Appl. Phys. Lett. 2001, 79(5), 2001; and barium oxide. In order to provide efficient injection of electrons into the device, the cathode preferably has a workfunction of less than 3.5 eV, more preferably less than 3.2 eV, most preferably less than 3 eV. Work functions of metals can be found in, for example, Michaelson, J. Appl. Phys. 48(11), 4729, 1977.

The cathode may be opaque or transparent. Transparent cathodes are particularly advantageous for active matrix devices because emission through a transparent anode in such devices is at least partially blocked by drive circuitry located underneath the emissive pixels. A transparent cathode will comprises a layer of an electron injecting material that is sufficiently thin to be transparent. Typically, the lateral conductivity of this layer will be low as a result of its thinness. In this case, the layer of electron injecting material is used in combination with a thicker layer of transparent conducting material such as indium tin oxide.

It will be appreciated that a transparent cathode device need not have a transparent anode (unless, of course, a fully transparent device is desired), and so the transparent anode used for bottom-emitting devices may be replaced or supplemented with a layer of reflective material such as a layer of aluminum. Examples of transparent cathode devices are disclosed in, for example, GB 2348316.

Encapsulation

Optical devices tend to be sensitive to moisture and oxygen. Accordingly, the substrate preferably has good barrier properties for prevention of ingress of moisture and oxygen into the device. The substrate is commonly glass, however alternative substrates may be used, in particular where flexibility of the device is desirable. For example, the substrate may comprise a plastic as in U.S. Pat. No. 6,268,695 which discloses a substrate of alternating plastic and barrier layers or a laminate of thin glass and plastic as disclosed in EP 0949850.

The device is preferably encapsulated with an encapsulant (not shown) to prevent ingress of moisture and oxygen. Suitable encapsulants include a sheet of glass, films having suitable barrier properties such as alternating stacks of polymer and dielectric as disclosed in, for example, WO 01/81649 or an airtight container as disclosed in, for example, WO 01/19142. A getter material for absorption of any atmospheric moisture and/or oxygen that may permeate through the substrate or encapsulant may be disposed between the substrate and the encapsulant.

Solution Processing

A single polymer or a plurality of polymers may be deposited from solution to form layer 3. Suitable solvents for polyarylenes, in particular polyfluorenes, include mono- or poly-alkylbenzenes such as toluene and xylene. Particularly preferred solution deposition techniques are spin-coating and inkjet printing.

Spin-coating is particularly suitable for devices wherein patterning of the electroluminescent material is unnecessary—for example for lighting applications or simple monochrome segmented displays.

Inkjet printing is particularly suitable for high information content displays, in particular full color displays. A device may be inkjet printed by providing a patterned layer over the first electrode and defining wells for printing of one color (in the case of a monochrome device) or multiple colors (in the case of a multicolor, in particular full color device). The patterned layer is typically a layer of photoresist that is patterned to define wells as described in, for example, EP 0880303.

As an alternative to wells, the ink may be printed into channels defined within a patterned layer. In particular, the photoresist may be patterned to form channels which, unlike wells, extend over a plurality of pixels and which may be closed or open at the channel ends.

Other solution deposition techniques include dip-coating, roll printing and screen printing.

If multiple layers of the device are formed by solution processing then the skilled person will be aware of techniques to prevent intermixing of adjacent layers, for example by crosslinking of one layer before deposition of a subsequent layer or selection of materials for adjacent layers such that the material from which the first of these layers is formed is not soluble in the solvent used to deposit the second layer.

Hosts for Phosphorescent Emitters

End-capped polymers of the present invention may be used as hosts for emissive dopants, in particular phosphorescent dopants. Numerous hosts are described in the prior art. The host material should have a $T_1$ energy level sufficiently high for excited state energy to be transferred from the $T_1$ energy level of the host to the T1 level of the emitter. Preferably, the host has a $T_1$ energy level sufficiently high to prevent energy back-transfer from the $T_1$ energy level of the emitter, and in particular a $T_1$ energy level higher than that of the emitter. However, in some cases the $T_1$ energy level of the host may be the same, or even lower, than that of the emitter.

Metal Complexes

Preferred metal complexes comprise optionally substituted complexes of formula (III):

wherein M is a metal; each of $L^1$, $L^2$ and $L^3$ is a coordinating group; q is an integer; r and s are each independently 0 or an integer; and the sum of (a. q)+(b. r)+(c.s) is equal to the number of coordination sites available on M, wherein a is the number of coordination sites on $L^1$, b is the number of coordination sites on $L^2$ and c is the number of coordination sites on $L^3$.

Heavy elements M induce strong spin-orbit coupling to allow rapid intersystem crossing and emission from triplet or higher states (phosphorescence). Suitable heavy metals M include:

lanthanide metals such as cerium, samarium, europium, terbium, dysprosium, thulium, erbium and neodymium; and d-block metals, in particular those in rows 2 and 3 i.e. elements 39 to 48 and 72 to 80, in particular ruthenium, rhodium, pallaidum, rhenium, osmium, iridium, platinum and gold.

Suitable coordinating groups for the f-block metals include oxygen or nitrogen donor systems such as carboxylic acids, 1,3-diketonates, hydroxy carboxylic acids, Schiff bases including acyl phenols and iminoacyl groups. As is known, luminescent lanthanide metal complexes require sensitizing group(s) which have the triplet excited energy level higher than the first excited state of the metal ion. Emission is from an f-f transition of the metal and so the emission color is determined by the choice of the metal. The sharp emission is generally narrow, resulting in a pure color emission useful for display applications.

The d-block metals are particularly suitable for emission from triplet excited states. These metals form organometallic complexes with carbon or nitrogen donors such as porphyrin or bidentate ligands of formula (IV):

wherein $Ar^4$ and $Ar^5$ may be the same or different and are independently selected from optionally substituted aryl or heteroaryl; $X^1$ and $Y^1$ may be the same or different and are independently selected from carbon or nitrogen; and $Ar^4$ and $Ar^5$ may be fused together. Ligands wherein $X^1$ is carbon and $Y^1$ is nitrogen are particularly preferred.

Examples of bidentate ligands are illustrated below:

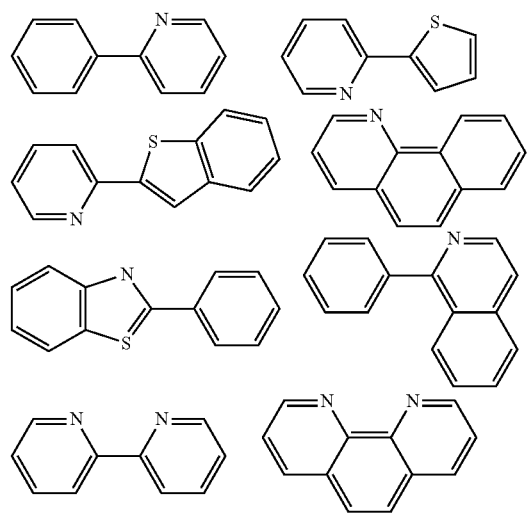

Each of $Ar^4$ and $Ar^5$ may carry one or more substituents. Two or more of these substituents may be linked to form a ring, for example an aromatic ring. Particularly preferred substituents include fluorine or trifluoromethyl which may be used to blue-shift the emission of the complex as disclosed in WO 02/45466, WO 02/44189, US 2002-117662 and US 2002-182441; alkyl or alkoxy groups as disclosed in JP 2002-324679; carbazole which may be used to assist hole transport to the complex when used as an emissive material as disclosed in WO 02/81448; bromine, chlorine or iodine which can serve to functionalize the ligand for attachment of further groups as disclosed in WO 02/68435 and EP 1245659; and dendrons which may be used to obtain or enhance solution processability of the metal complex as disclosed in WO 02/66552.

A light-emitting dendrimer typically comprises a light-emitting core bound to one or more dendrons, wherein each dendron comprises a branching point and two or more dendritic branches. Preferably, the dendron is at least partially conjugated, and at least one of the core and dendritic branches comprises an aryl or heteroaryl group.

Other ligands suitable for use with d-block elements include diketonates, in particular acetylacetonate (acac); triarylphosphines and pyridine, each of which may be substituted.

Main group metal complexes show ligand based, or charge transfer emission. For these complexes, the emission color is determined by the choice of ligand as well as the metal.

The host material and metal complex may be combined in the form of a physical blend. Alternatively, the metal complex may be chemically bound to the host material. In the case of a polymeric host, the metal complex may be chemically bound as a substituent attached to the polymer backbone or incorporated as a repeat unit in the polymer backbone as disclosed in, for example, EP 1245659, WO 02/31896, WO 03/18653 and WO 03/22908.

The end-capped polymer of the present invention may also serve as hosts for fluorescent dopants. A wide range of fluorescent low molecular weight metal complexes are known and have been demonstrated in organic light emitting devices [see, e.g., Macromol. Sym. 125 (1997) 1-48, U.S. Pat. No. 5,150,006, U.S. Pat. No. 6,083,634 and U.S. Pat. No. 5,432, 014]. Suitable ligands for di or trivalent metals include: oxinoids, e. g. with oxygen-nitrogen or oxygen-oxygen donating atoms, generally a ring nitrogen atom with a substituent oxygen atom, or a substituent nitrogen atom or oxygen atom with a substituent oxygen atom such as 8-hydroxyquinolate and hydroxyquinoxalinol-10-hydroxybenzo (h) quinolinato (II), benzazoles (III), schiff bases, azoindoles, chromone derivatives, 3-hydroxyflavone, and carboxylic acids such as salicylato amino carboxylates and ester carboxylates. Optional substituents include halogen, alkyl, alkoxy, haloalkyl, cyano, amino, amido, sulfonyl, carbonyl, aryl or heteroaryl on the (hetero) aromatic rings which may modify the emission color. Other The embodiment of FIG. 3 illustrates a device wherein the device is formed by firstly forming an anode on a substrate followed by deposition of an electroluminescent layer and a cathode, however it will be appreciated that the device of the invention could also be formed by firstly forming a cathode on a substrate followed by deposition of an electroluminescent layer and an anode.

The invention claimed is:

1. A method for end-capping a semi-conducting polymer, wherein:
the polymer is formed by polymerizing at least two distinct sets of monomers in the presence of a metal catalyst,
the first set of monomers comprises one or more monomers comprising at least one amine group,
the second set of monomers comprises one or more monomers for forming an arylene repeat unit,
said method comprises replacing an end group of at least one terminus of a semi-conducting polymer with an end-capping group of formula $(Ar)_n-$ by reacting the end-group with an end-capping compound of formula (V):

$(Ar)_n-X$       (V)

wherein Ar in each occurrence independently represents an optionally substituted phenyl group; n is at least 3; and X is a leaving group selected from a boronic acid, a boronic acid ester, halogen and a sulfonic acid ester; and
said end-capping group is not charge transporting.

2. A method according to claim 1, comprising at least partially controlling the molecular weight of the polymer by using an excess of brominated monomer.

3. A method according to claim 1, wherein said first set of monomers polymerizes more slowly than said second set of monomers.

4. A method according to claim 1, wherein said end-capping group does not comprise a nitrogen atom.

5. A method according to claim 1 wherein:
the one or more monomers comprising at least one amine group are monomers for forming a repeat unit of formula (II):

Ar$^1$ and Ar$^2$ are optionally substituted aryl or heteroaryl groups; m is greater than or equal to 1; R is H or a substituent; and any of the aryl or heteroaryl groups in the repeat unit of formula (II) may be linked by a direct bond or a divalent linking atom or group; and
the second set of monomers comprise monomers for forming arylene repeat units.

6. A method according to claim 5 wherein the monomers for forming arylene repeat units are monomers for forming 2,7-linked fluorene repeat units.

7. A method according to claim 1, wherein said metal catalyst is a palladium catalyst.

\* \* \* \* \*